(12) United States Patent
Fehsenfeld et al.

(10) Patent No.: US 7,369,014 B1
(45) Date of Patent: May 6, 2008

(54) FLEXIBLE SURFACE ACOUSTIC WAVE DEVICE

(75) Inventors: Joseph C. Fehsenfeld, 266 Steeplechase Rd., Barrington Hills, IL (US) 60010; Greg N. Miller, Vernon Hills, IL (US); Jeffrey C. Andle, Westbrook, ME (US)

(73) Assignee: Joseph C. Fehsenfeld, Barrington Hills, IL (US)

( * ) Notice: Subject to any disclaimer, the term of this patent is extended or adjusted under 35 U.S.C. 154(b) by 18 days.

(21) Appl. No.: 11/129,054

(22) Filed: May 12, 2005

Related U.S. Application Data

(60) Provisional application No. 60/570,357, filed on May 12, 2004.

(51) Int. Cl.
H03H 9/64 (2006.01)

(52) U.S. Cl. .................. 333/193; 333/150; 310/313 R; 340/10.1

(58) Field of Classification Search ................ 333/193; 235/444; 310/313 R
See application file for complete search history.

(56) References Cited

U.S. PATENT DOCUMENTS

| | | | | |
|---|---|---|---|---|
| 4,242,671 A | * | 12/1980 | Plows | 367/2 |
| 4,625,184 A | * | 11/1986 | Niitsuma et al. | 333/150 |
| 4,737,789 A | * | 4/1988 | Nysen | 342/51 |
| 5,364,093 A | | 11/1994 | Huston et al. | |
| 5,434,789 A | | 7/1995 | Fraker et al. | |
| 5,438,305 A | * | 8/1995 | Hikita et al. | 333/32 |
| 5,438,518 A | | 8/1995 | Bianco et al. | |
| 5,507,485 A | | 4/1996 | Fisher | |
| 5,524,081 A | | 6/1996 | Paul | |
| 5,734,326 A | * | 3/1998 | Skudera, Jr. | 340/572.1 |
| 5,740,077 A | | 4/1998 | Reeves | |
| 5,772,534 A | | 6/1998 | Dudley | |
| 5,810,680 A | | 9/1998 | Lobb et al. | |
| 5,878,369 A | | 3/1999 | Rudow et al. | |
| 5,882,269 A | | 3/1999 | Lewis | |
| 5,955,949 A | * | 9/1999 | Cocita | 340/572.1 |
| 6,096,964 A | * | 8/2000 | Ghamaty et al. | 136/201 |
| 6,263,279 B1 | | 7/2001 | Bianco et al. | |
| 6,312,777 B1 | * | 11/2001 | Smith | 428/41.8 |
| 6,456,938 B1 | | 9/2002 | Barnard | |
| 6,496,141 B2 | | 12/2002 | Pippin | |
| 6,518,885 B1 | * | 2/2003 | Brady et al. | 340/572.7 |
| 6,958,696 B2 | * | 10/2005 | Hartmann et al. | 340/572.1 |
| 6,966,493 B2 | * | 11/2005 | Hartmann | 235/454 |
| 6,973,716 B2 | * | 12/2005 | Chung et al. | 29/832 |
| 7,103,948 B1 | * | 9/2006 | Hartmann et al. | 29/25.35 |
| 7,158,037 B2 | * | 1/2007 | Forster et al. | 340/572.8 |
| 2004/0131897 A1 | * | 7/2004 | Jenson et al. | 429/7 |

* cited by examiner

Primary Examiner—Barbara Summons
(74) Attorney, Agent, or Firm—Schwartz Cooper Chartered

(57) ABSTRACT

A surface acoustic wave device is provides and comprises a flexible substrate having a first side and a piezoelectric film attached to at least a portion of the first side of the flexible substrate. The piezoelectric film can have a first side and a second side. A surface acoustic wave circuit can adjoin at least a portion of the first side of the piezoelectric film. These devices can comprise thin and flexible substrates, such as polyimide to make the devices flexible. If adhesive is applied to the back of devices constructed in accordance with the invention, such devices can be adhered to almost any surface, even a curved surface. The devices of the present invention can be easily integrated with other devices.

1 Claim, 16 Drawing Sheets

Use of a sacrificial layer to create an air gap under a piezoelectric film for either FBAR or SAW (depicted). Layers are built over the sacrificial material, which is etched away after processing is complete.

A loop antenna connects the top electrode and the inner metal (bottom electrode) in an FBAR.

Ideal resonance of unsupported 1.5μ AlN.

Resonance with 0.1μ aluminum electrodes and 50μ high Q upilex. This was the expected resonance family of the test devices.

Reducing the Q*F product of the upilex to $15 \times 10^9$, as estimated. This is similar to measurements.

Simple tungsten reflection layer added, and thicknesses adjusted, high Q assumed for upilex.

Accounting for the Q*F value measured as $15 \times 10^9$ for upilex.

(Left) 25μ upilex and (right) 50 μ upilex with 0.55μ tungsten mirror. The data represents the reflection coefficient of the tungsten/upilex as seen by aluminum nitride with QF = $15 \times 10^{11}$ (red, high Q limit), $15 \times 10^9$ (green, estimated value), and $15 \times 10^7$ (blue, low Q limit).

(Left) 25µ upilex and (right) 50 µ upilex with optimized 0.4µ tungsten mirror. The data represents the reflection coefficient of the tungsten/upilex as seen by aluminum nitride with QF = $15 \times 10^{11}$ (red, high Q limit), $15 \times 10^9$ (green, estimated value), and $15 \times 10^7$ (blue, low Q limit).

| Material | $C_{11}$ (GPa) | $\eta_{11}$ (Pa-S) | $C_{44}$ (GPa) | $\eta_{44}$ (Pa-S) | $\rho$ (kg/m³) | $V_L$ (μm/ns) | $Z_L$ | $Q_L F$ | $V_{SH}$ (μm/ns) | $Z_{SH}$ | $Q_{SH} F$ | $V_{SAW}$ (μm/ns) |
|---|---|---|---|---|---|---|---|---|---|---|---|---|
| W | 542.1 | | 145.9 | | 19300 | 5.30 | 102.9 | | 2.75 | 53.1 | | ~2.5 |
| Ta | 200 | | | | 16500 | 3.48 | 57.4 | | | | | |
| diamond | *1079.* | | *578.0* | | *3515* | *17.52* | *59.2* | | *12.82* | *45.1* | | ~11.0 |
| Cr | 350.0 | | 101.0 | | 7140 | 7.00 | 50.0 | | 3.76 | 26.9 | | ~3.5 |
| a-C:N | 392.1 | | 185.7 | | 3000 | 11.40 | 34.3 | | 7.87 | 23.6 | | ~11.0 |
| f-AlN[1] | 400.0 | .04 | 130.0 | .013 | 3240 | 11.11 | 36.0 | 1000 | 6.33 | 20.5 | 1000 | ~5.1 |
| Si₃N₄ | *329.0* | | *100.0* | | *2900* | *10.7* | *30.9* | | *5.87* | *17.0* | | *~5.1* |
| Vitralloy[2] | 122.5 | 0.2 | 35.0 | 0.1 | 6100 | 4.48 | 27.3 | 610 | 2.40 | 14.6 | 350 | ~2.2 |
| Al | 109.0 | 0.2 | 23.0 | 0.1 | 2700 | 6.35 | 17.2 | 545 | 2.92 | 7.9 | 230 | ~2.7 |
| f-SiO₂[3] | 78.5 | 0.2 | 31.2 | 0.1 | 2200 | 5.97 | 13.1 | 390 | 3.77 | 8.3 | 312 | ~3.1 |
| Upilex | 8.8 | 0.7 | 3.0 | 0.3 | 1470 | 2.45 | 3.6 | 13 | 1.43 | 2.1 | 10 | ~1.2 |
| Pt[4] | 6.0 | | 1.5 | | 1363 | 2.10 | 2.9 | | 1.03 | 1.4 | | ~1.0 |

FIG. 19

FLEXIBLE SURFACE ACOUSTIC WAVE DEVICE

CROSS-REFERENCE TO RELATED APPLICATIONS

This application claims priority from U.S. Provisional Application No. 60/570,357, filed May 12, 2004.

FEDERALLY SPONSORED RESEARCH OR DEVELOPMENT

Not applicable.

TECHNICAL FIELD

The present invention relates to a surface acoustic wave (SAW) devices.

SUMMARY OF THE INVENTION

SAW devices built in accordance with the present invention can comprise a flexible substrate having a first side and a piezoelectric film attached to at least a portion of the first side of the flexible substrate. The piezoelectric film can have a first side and a second side. A surface acoustic wave circuit can adjoin at least a portion of the first side of the piezoelectric film. The device can be ultra-thin and flexible. These devices can be less than 2 thousandths of an inch (2 mils) thick. These devices can comprise thin and flexible substrates, such as polyimide to make the devices flexible. If adhesive is applied to the back of devices constructed in accordance with the invention, such devices can be adhered to almost any surface, even a curved surface. The devices of the present invention can be easily integrated with other devices. When other planar circuits such as antennas, normal planar RF filters, couplers and power dividers etc, are connected or combined together with SAW devices, these planar circuits can be manufactured on the same substrate as the device of the present invention, using the same metallization process. This makes it easy for SAW devices to be integrated with other circuits.

The cost to create SAW devices can be reduced by fabricating many circuits, including the SAW circuits, on a single device using one metallization process. No assembly process is needed in many of the embodiments.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings in which:

FIG. 19 is a chart of testing and other data for one or more embodiments of the SAW device of the present invention.

DETAILED DESCRIPTION

Figure 1:
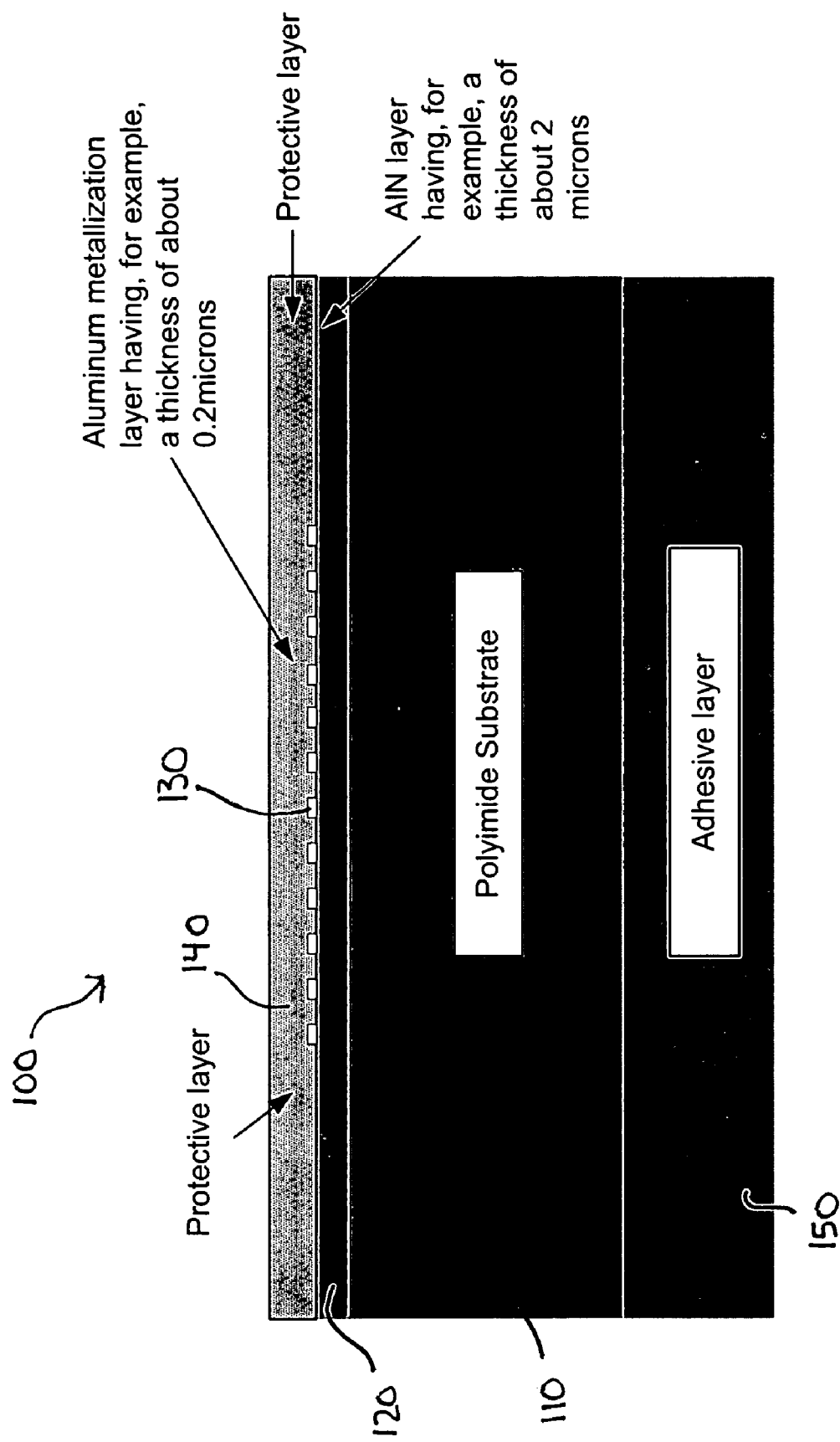
FIG. 1 is cross-sectional side view of one SAW device of the present invention.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The following provides a description of manufacturing methods for the SAW device of the present invention, and further provides descriptions of a number of example embodiments of SAW devices of the present invention.

In one embodiment shown in FIG. 1, the SAW device 100 comprises a substrate 110. The substrate 110 can be any suitable layer such as polyimide, which may be thin such as, for example, ½ to 1 mil thick. Preferably, the substrate layer 110 is flexible. The SAW device 100 further comprises a piezoelectric material thin film 120 such as aluminum nitride (AlN) and/or zinc oxide (ZnO), which can be sputtered onto the substrate 110 to form a piezoelectric thin film 120. This could also be an organic and/or a non-organic material. AlN deposition can be performed by depositing highly oriented AlN (using reactive sputtering, or any other method which produces the same results) with a full width half maximum (FWHM) of 2.6° in one example. Careful control of the deposition process may be needed to obtain the high degree of orientation. AlN deposition can be done at room temperature. Of course, although one example degree of sputtering has been given, there are many different angles and degrees that this can be applied. Sputtering can also be performed using ZnO and any other material that creates a piezoelectric thin film effect.

A SAW circuit (and other circuits if needed) can be fabricated as a metallization layer 130 on top of the piezoelectric layer 120. The conductive material can be selected from a number of different materials (such as aluminum) can be used, if AlN is used for the piezoelectric thin film 120. For some applications, such as an interdigital transducer (IDT) in the SAW device for high frequency application, such as, for example, 2.4 GHz, the line width and spacing can be smaller than 1 micron. To achieve such small line widths and spacings, a deep ultraviolet (DUV) lithography method can be used or any other method known to one having ordinary skill in the art. There are many frequencies to which this fabrication technique can be applied. The IDT's dimensions correspond to the frequency used.

A protective layer 140 can be provided to protect the very small circuit. If a protective layer 140 is used, a protective layer 140 of material can be adhered to the metallization layer 130 after lithography, photolithography, and/or etching.

An adhesive layer 150 can be applied to the bottom side of substrate 110. In one embodiment, the adhesive layer 150 can be, but is not necessarily limited to, a thickness of about 0.25 to 0.5 mil.

Figure 2:
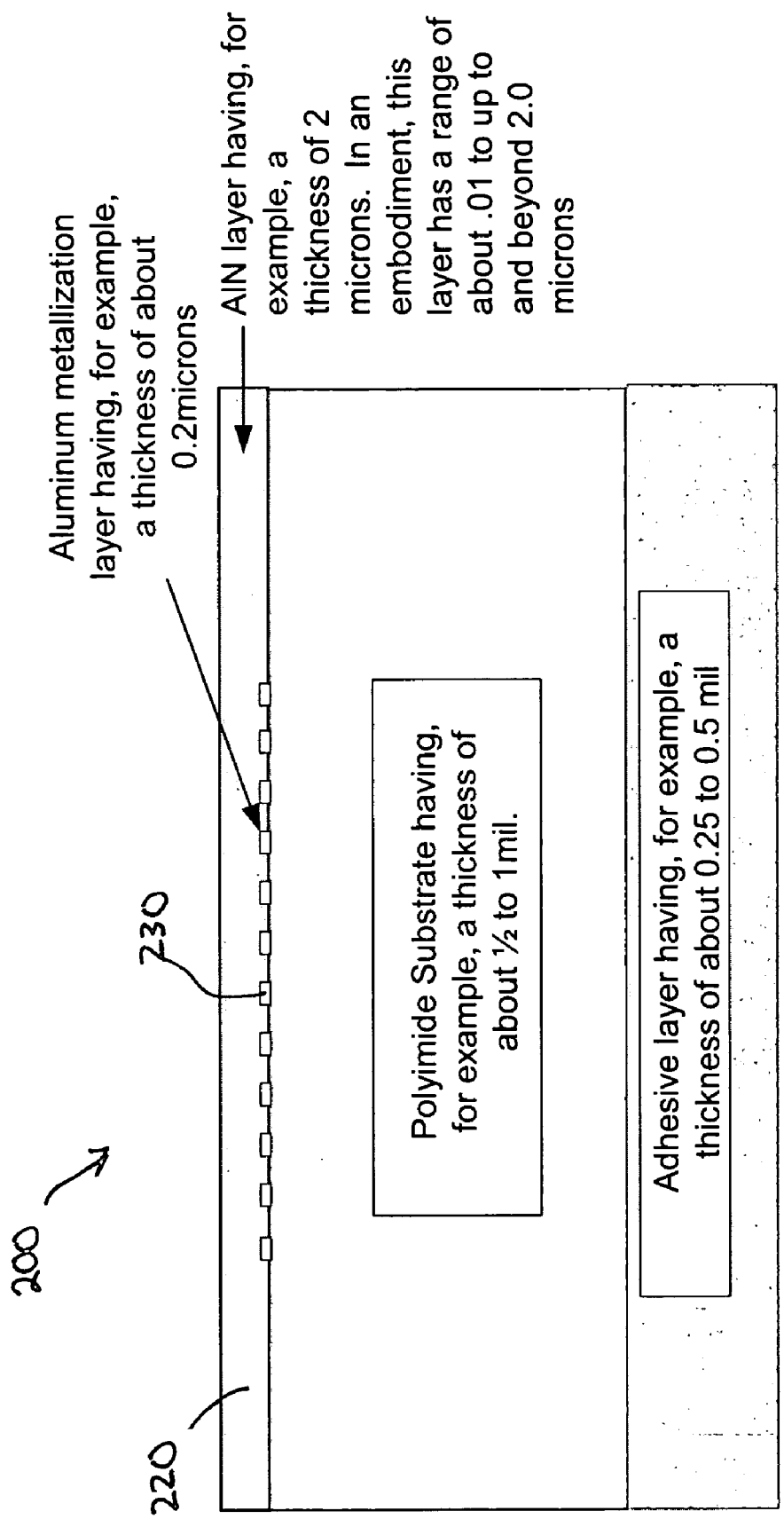
FIG. 2 is cross-sectional side view of another SAW device of the present invention.

FIG. 2 shows an alternative configuration of a thin film device 200 in accordance with the present invention. In such an arrangement, a layer 220 such as AlN, which serves as a piezoelectric layer, can be positioned on top of metal or conductive circuit 230. In such an arrangement, the AlN layer 220 also serves as a protective layer and, therefore, no separate protective layer is provided.

Application 1—RF Filter

In one embodiment, the above described construction method can be used to build an extra-thin RF SAW filter.

Figure 3:
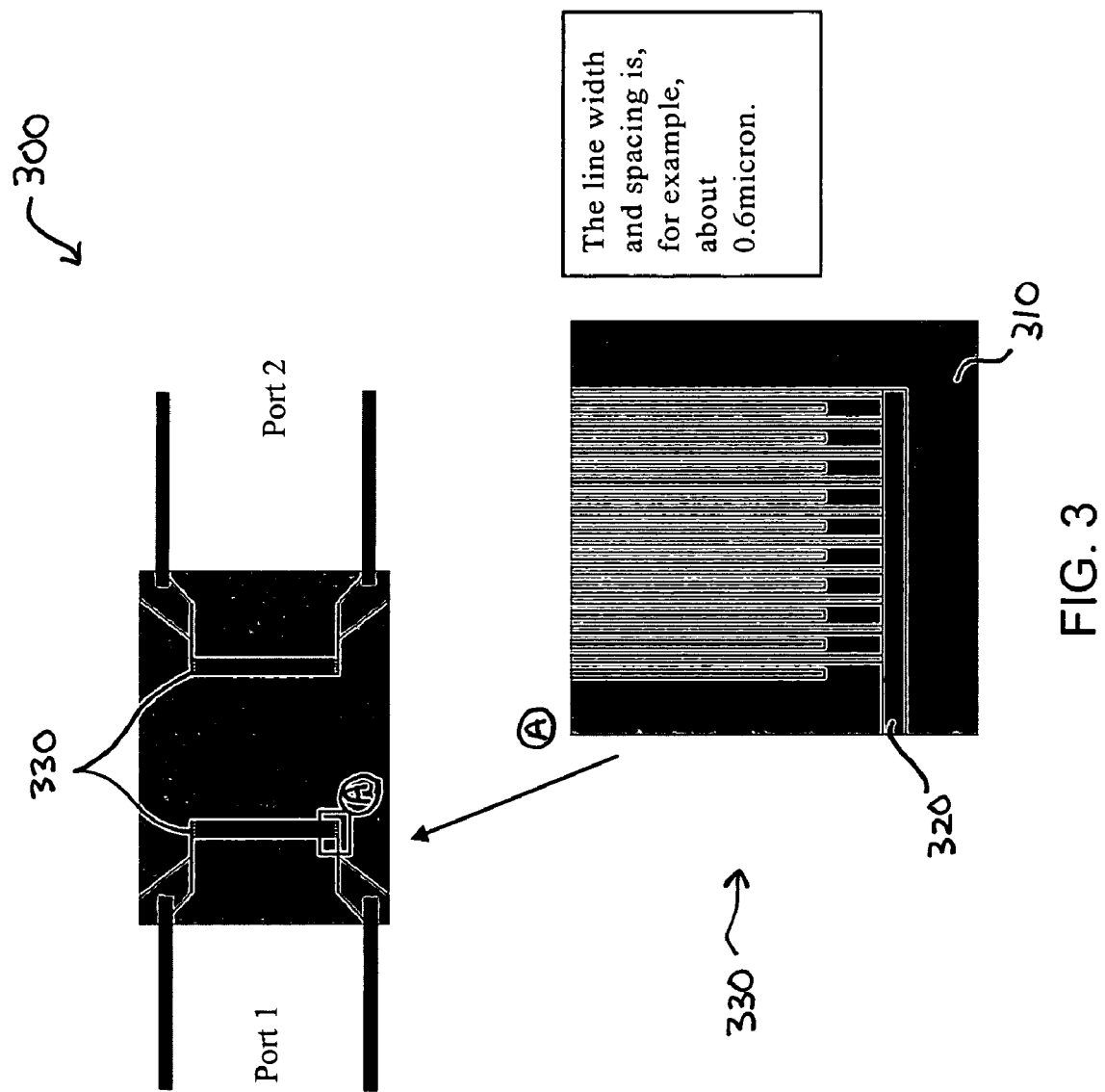
FIG. 3 is a top view of one embodiment of a two-port SAW device of the present invention.

FIG. 3 depicts a design of a two-port SAW device 300 using AlN thin film 320 on a substrate 310 such as, for example, a polyimide substrate. The design shown in FIG. 3 is for 2.4 GHz frequency range, assuming the velocity of the surface acoustic wave is 6000 meters per second (m/s). For operation in other frequency ranges, the structures shown in FIG. 3 are similar, but with dimensions of the structures are adjusted to accommodate desired operating frequencies. The core parts of this device are the two Inter-Digital Transducers (IDT) 330. The IDT 330 design shown in FIG. 3 is provided for illustrative purposes. In practice, the IDT finger length and profile are designed according to known filter specifications using a number of different design techniques. A widely used RF SAW filter design technique is the Fourier transformation, which dictates an IDT finger length profile based on RF filter specifications.

When one port of this device 300 is provided with an RF signal, surface acoustic waves will be excited by the IDT 330 connected to this port. Part of the surface wave energy will travel to the other IDT 330 and will be converted back to RF signal. This signal can be detected at the second port. The expected insertion loss of this device is in between 15-30 dB. Insertion loss may vary depending on design.

For AlN thin film 320, the phase velocity of the acoustic wave will be in the vicinity of 6000 meters per second (m/s). In this design, the distance between the two IDTs 330 is 0.2 mm, so that the time delay will, for example, be in the vicinity of 33.3 ns (3.33e-8 seconds). Electromagnetic waves travel 10 meters in this length of time. For a frequency of 2.4 GHz, the SAW wavelength will be in the order of 2.5 microns (2.5e-6 meter). The IDT finger line width and spacing is about quarter of a wavelength.

Application 2—Tag for Locating Object.

Figure 4:
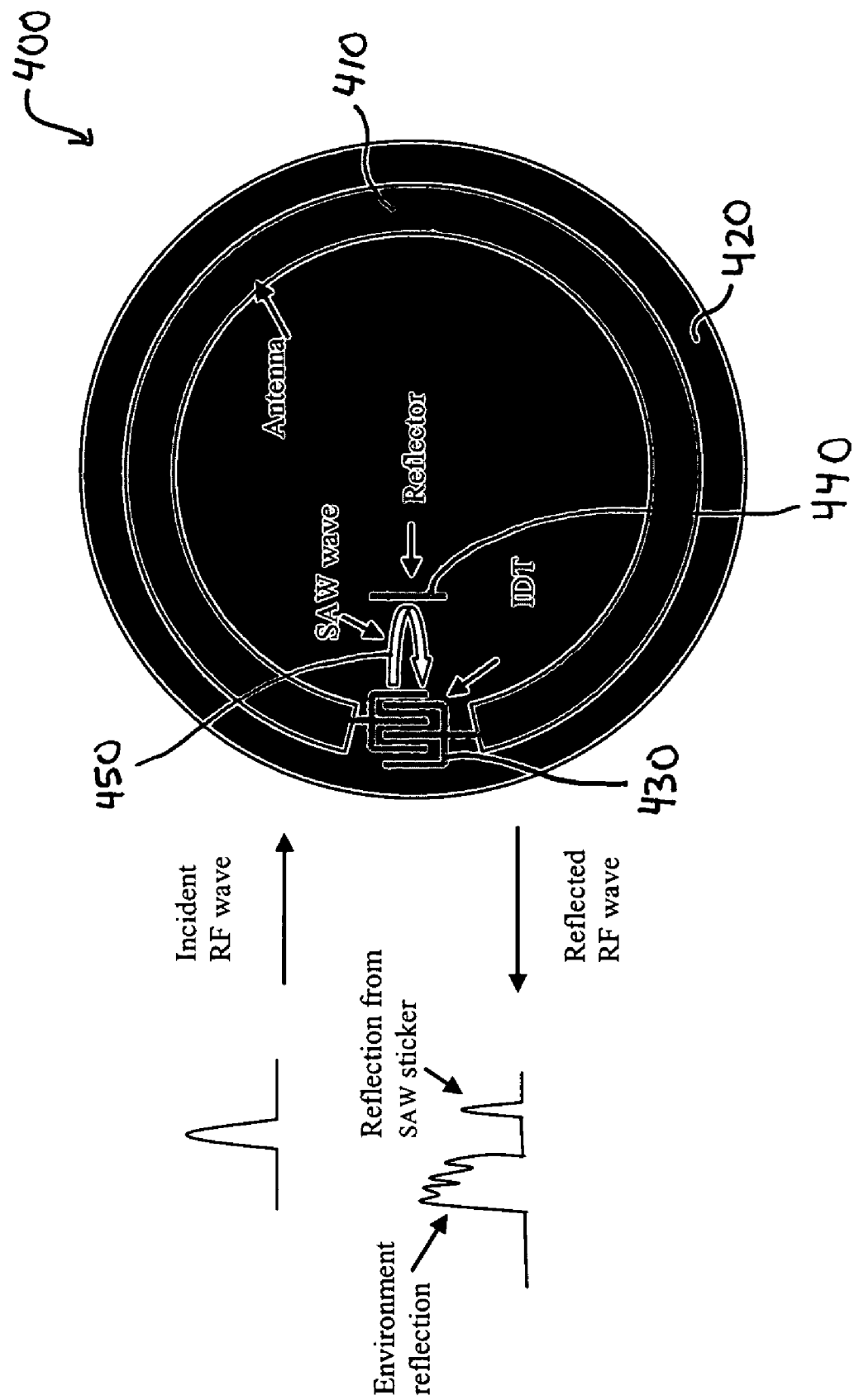
FIG. 4 is a top view of one embodiment of a sticker with SAW device of the present invention.

Another application of the SAW technology is for the use in a sticker or polymer application. The "sticker" can have an adhesive but does not have to have an adhesive. With or without the adhesive, the device can be inserted or located within or on another object, as will be understood from the following. In one embodiment, the sticker can be used to locate an object such as a golf ball, or any other object. FIG. 4 provides a schematic drawing of a sticker 400 including devices fabricated thereon. The antenna 410 and the SAW device (including the IDT 430 and the reflector 110) are built on the piezoelectric thin film layer 420. This sticker 400 is adhered onto the object to be located, and a handheld transceiver (not shown) is used to communicate with this sticker 400. Using a SAW device in locating an object rather than simply using a metal reflector can avoid problems caused by environment reflection and/or interference. Because this sticker 400 is very thin and flexible, it can be applied to almost any surface, even a curved surface, such as that of a golf ball or any other suitable object.

In one embodiment, the operation of the system includes the handheld transceiver transmitting an RF pulse. The antenna 410 receives this signal and passes it to the IDT 430. The IDT 430 converts this signal to a SAW wave 450 in the piezoelectric thin film 420. This SAW wave 450 travels to the reflector 440 and is reflected back by the reflector 440, which results in a time delay between environmental reflection and SAW reflection. The distance between the IDT 430 and the reflector 440 can control the length of the time delay. The reflected SAW wave 450 is converted to RF electrical energy by the IDT 430 and is re-radiated by the antenna 410. The handheld (or other suitable device) radar transceiver receives reflections from both the environment and the SAW sticker 400. Because of the reflection time delay caused by the SAW wave 450, the environment reflection comes back first and reflection from the SAW sticker 400 comes back second. By using a switch, which can be controlled by software, in the circuit in the handheld (or other suitable device) transceiver, it is possible to distinguish the environment reflection from the SAW sticker 400 reflection. Accordingly, the object on which the sticker 400 is located can be located.

The IDT 430 shown in FIG. 4 is bidirectional, which means the SAW wave 450 will travel in two directions. Half of the power, which travels to the reflector 440, will be useful, while the other half of the power, which travels to the other direction may be lost. There are some methods that can be used to solve this loss problem. For example, the reflector 440 can be placed at both sides of the IDT 430. An alternative solution is to use single-phase uni-directional transducer (SPUDT) technique.

Application 3—RFID Tag

In another embodiment of the present invention, a Radio Frequency Identification (RFID) tag can be used or implemented. This application is similar to the object-locating sticker in the previous "Application 2." One difference is in the number of reflectors on the SAW surface. For locating an object, only one reflector is needed, however, for identification purposes, more than one reflector is needed.

Figure 5:
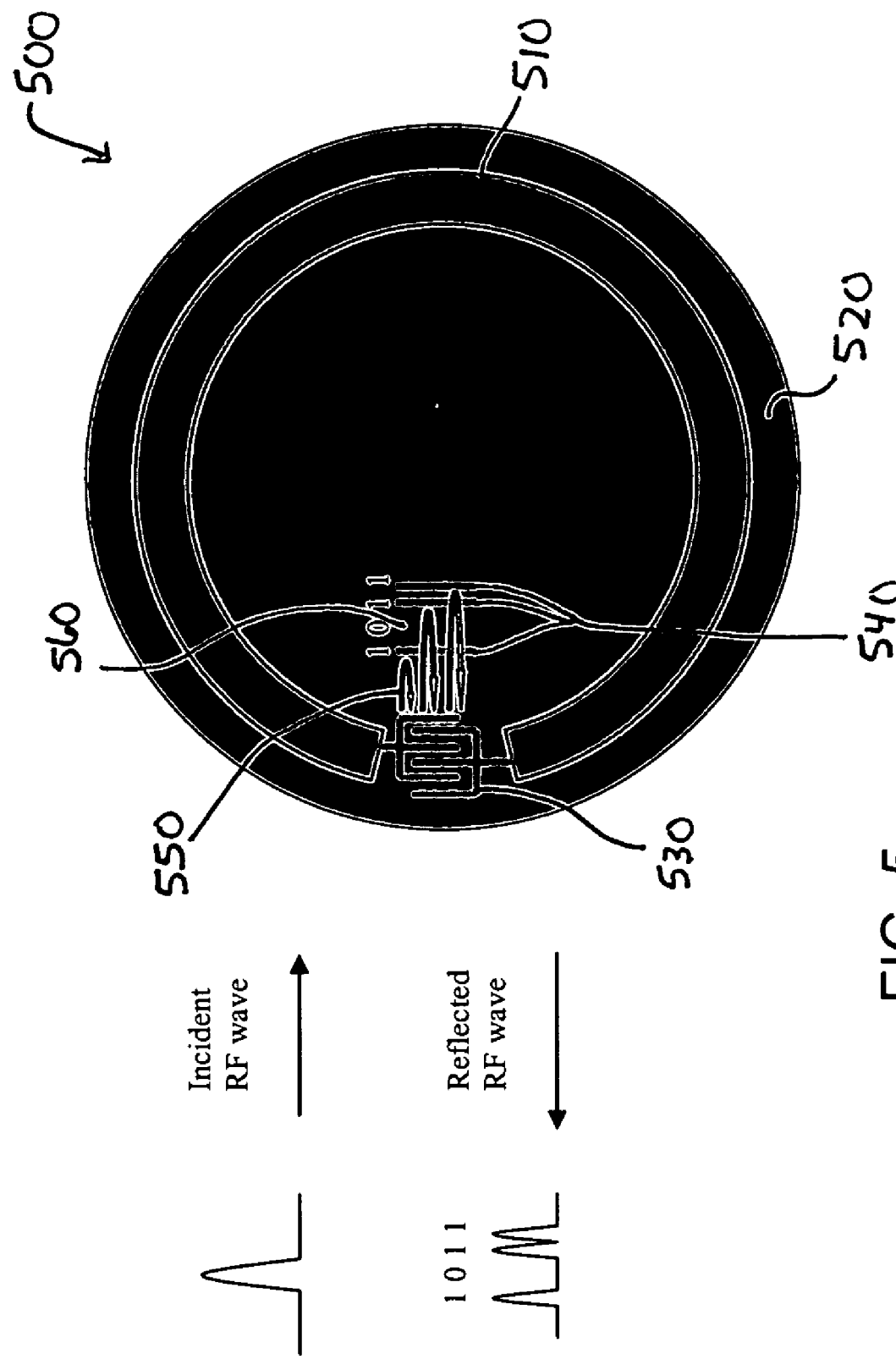
FIG. 5 is a top view of one embodiment of a sticker with four-digit SAW RFID tag of the present invention.
Figure 7:
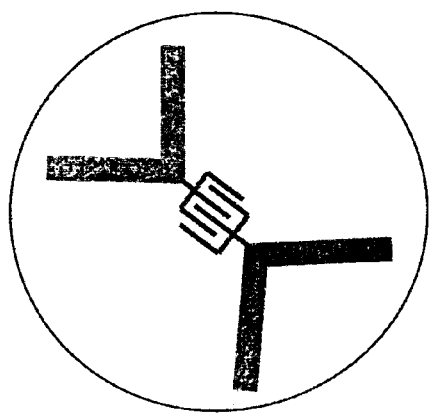
FIG. 7 is a top view of another embodiment of one antenna type and sticker shape of the SAW device of the present invention.
Figure 9:
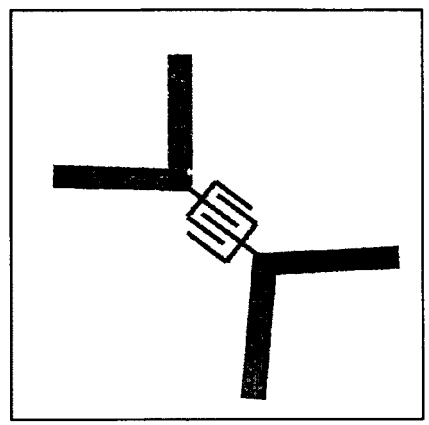
FIG. 9 is a top view of another embodiment of one antenna type and sticker shape of the SAW device of the present invention.
Figure 6:
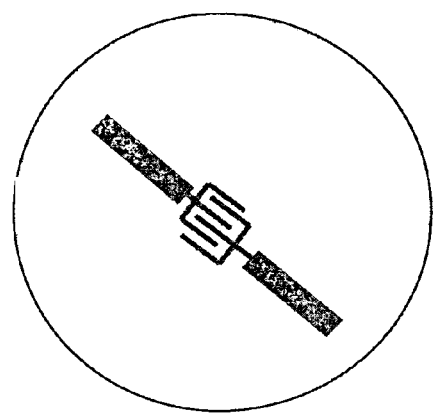
FIG. 6 is a top view of one embodiment of one antenna type and sticker shape of the SAW device of the present invention.
Figure 8:
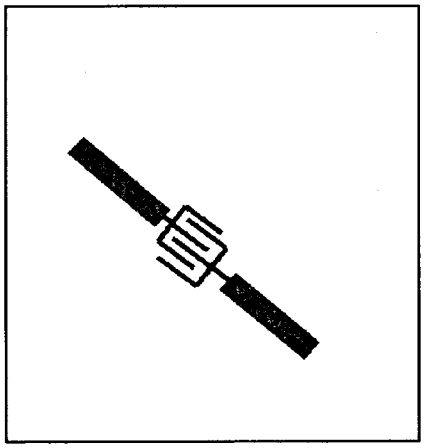
FIG. 8 is a top view of another embodiment of one antenna type and sticker shape of the SAW device of the present invention.

FIG. 5 shows one embodiment: a 4-digit SAW RFID tag 500. The number "1" is implemented with a reflector 540 and the number "0" is implemented by leaving a reflector space 560 empty. An SAW RFID reader (not shown) is needed to read the tag 500.

In one embodiment, the operation of the system includes the reader transmitting an RF pulse. The antenna 510 receives this signal. The IDT 530 converts this signal to a SAW wave 550 in the piezoelectric thin film 520. This SAW wave 550 travels to the reflectors 540. When the SAW wave 550 hits the $1^{st}$ reflector 540, part of the energy is reflected, and travels back to the IDT 530. This SAW energy is converted back to RF electric energy by IDT 530 and re-radiated by the antenna 510. The reader receives this RF pulse. This pulse is the first digit "1" which corresponds to the first reflector 540 on the SAW tag 500 surface. Part of the SAW energy continues to travel. As there is no reflector at the $2^{nd}$ position, no reflection happens, so the reader does not receive a pulse at the $2^{nd}$ time slot. The reader recognizes a "0". This "0" corresponds to the empty space 560 on the SAW tag 500 surface. The SAW wave 550 continues to travel and hit the reflector 540 at the $3^{rd}$ position. Again part of the SAW energy will be reflected. Similar to the $1^{st}$ reflection, this reflected energy will be received by the reader and so the reader will recognize a "1". Part of the SAW energy continues to travel to the reflector 540 at the $4^{th}$ position. The same as other reflectors 540, the SAW wave 550 is reflected and detected by the reader and produces a digit "1". In this way, the reader reads the tag 500 as "1 0 1 1".

An advantage of this tag is its ultra-thin thickness. It can be less than 2 mils so it can be embedded in paper. There are many other possibilities of materials or devices to which this device can be attached or in which this device may be embedded. For example, this device may be affixed to, or embedded in, any type of material, cardboard or practically anything with an adhesive process. The entire tag, including the SAW device and the antenna, can be fabricated from one piece, so the tag is chipless.

Currently most of RFID tags use IC chips. Although the IC chip is very small (Mu-chip from Hitachi is just 0.4×0.4 mm), the thickness of the IC chip is still a concern in some applications. Although RFID tags may be known, such tags are not made of thin film technology and are therefore much thicker than the present invention. The flexible substrate also significant, and makes the Tag, Filter and Locator flexible enough to be attached to any surface. In one embodiment, the thickness of these devices can be anywhere from about 27 up to about 65 microns thick.

Other Antenna Forms:

In the description provided above, a loop antenna has been illustrated for use with the SAW devices. However, referring to FIGS. 6-9, other antennas can be used as possible substitutes, such as dipole and cross dipole antennas. The sticker (or tag) can be other shapes, such as rectangular, as well.

Application 4—Complex Locator

The above description describes the manufacturing process of a passive SAW device. With this SAW device and a transceiver, one can locate virtually anything having the device attached thereto or built therein. Because the SAW device is capable of RFID, the device can be easily adapted to locate electronic devices, such as cell phones, Personal Data Accessory (PDA), Blackberry-type devices, laptop computers, and other instruments capable of transmitting and receiving RF signals. Specifically, a cell phone, as with other electronic devices, already includes many of the components needed to become a "reader" of both RFID and a one-signal transaction. By modifying such electronic devices, they can become a reader of the signals emanating from the SAW device and will permit such signals to bounce back from the SAW device.

Active devices, namely those having a power supply connected thereto or built therein, can also be easily adapted similar to those electronic devices just noted. It is well recognized that RFID and the capability of reading, locating and collecting data therefrom, such as by tags, is already a large industry. As such, incorporating the technology described above into cell phones, or other like devices, is an added feature having tremendous possibilities. With such technology as described herein, one is able to locate cell phones, TV remotes, car keys, wallets, PDA's, laptop computers, and even a golf ball on the course. Utilizing existing technology, with changes as noted herein, to these receiving devices will enable them to become a specific transponder for locating either a sticker or another device with similar capabilities, either passively or actively.

Thus, the present invention, including a method of fabricating a low-cost, flexible, adhesive acoustic wave device, is well suited for high volume RFID applications. Flexible substrate materials have poor acoustic quality at the licensed frequencies for such devices (~318 MHz, ~900 MHz and ~2400 MHz for example). While surface acoustic wave (SAW) devices are preferred, film bulk acoustic resonators (FBAR) can also provide useful echoes for location devices.

The deposition of a thick piezoelectric layer, where thick is defined relative to the acoustic wavelength of a SAW or is one half of a wavelength for an FBAR may be known. However, there is a practical minimum of the acoustic SAW wavelength of ~2μ as a result of increasing metal resistance. At the target frequency of 2400 MHz, it is expected that the SAW wavelength will be approaching 2μ, making this an upper limit of feasibility. The SAW penetration depth at 90% energy trapping is on the order of a wavelength, requiring an aluminum nitride thickness in excess of 2μ. The present invention has demonstrated deposition capability to 1-1.5μ, and 2.5μ thickness films may be readily be obtained. However, even at 2.5μ, a substantial amount of energy extends into the substrate.

An FBAR was proposed as a short-cut to a working acoustic wave device and was expected to offer a simple resonant structure. FBAR devices have been made with 1.5 μAlN on UPILEX®-S high temperature resistant polyimide film sheets of 25μ and 50μ thickness. UPILEX® high temperature resistant polyimide film exhibits a Q*F product of less than 15 GHz whereas the target Q*F product is $10^{12}$ (1 μs ring time at 1 GHz). The low Q*F properties were due to the UPILEX® high temperature resistant polyimide film material and methods are required to evaluate FBAR devices without the ill effects of the UPILEX® high temperature resistant polyimide film.

Figure 10:
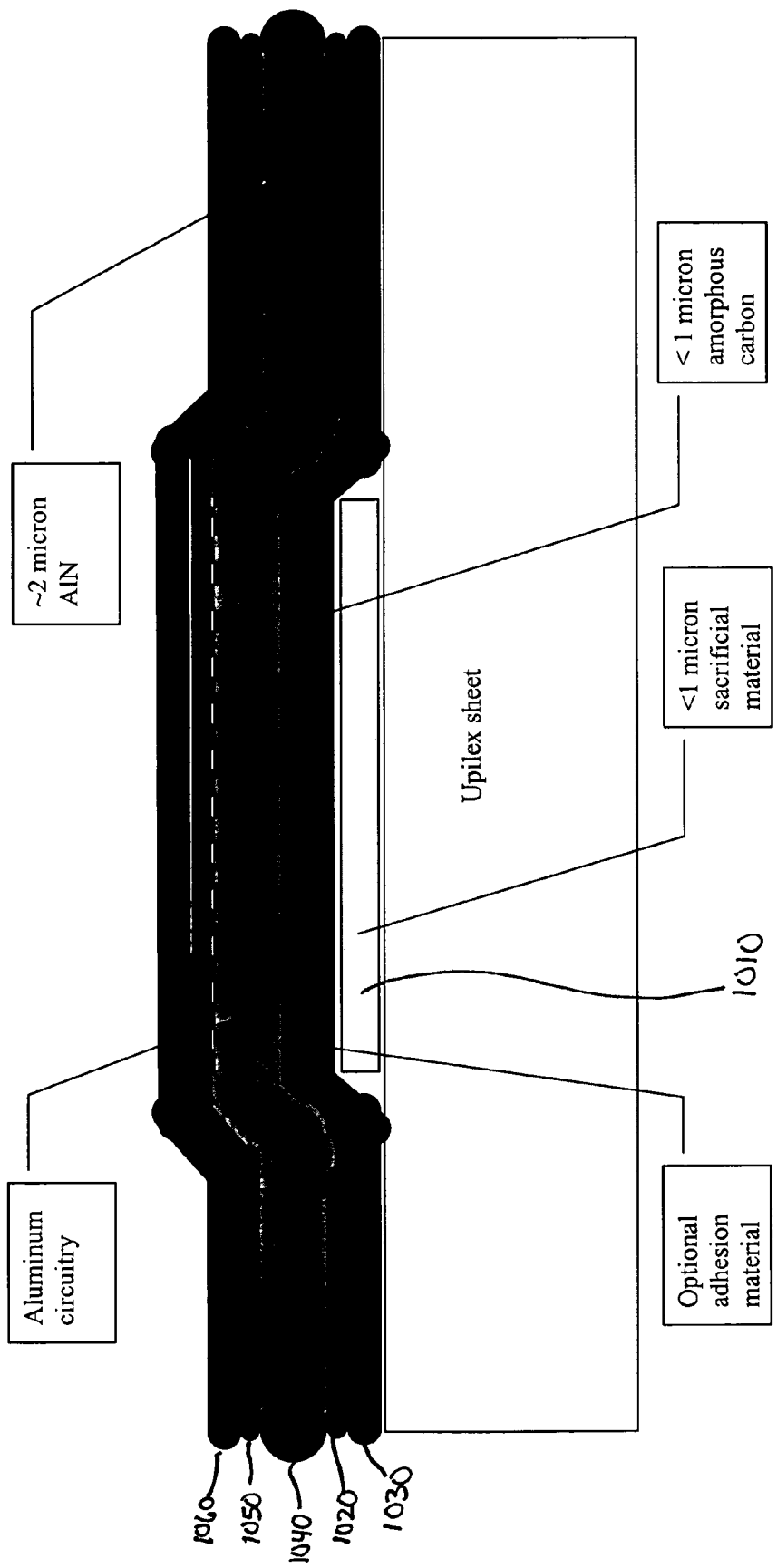
FIG. 10 is a cross section side view of one FBAR embodiment which can be used for a SAW device of the present invention.

FBAR devices can be made with air gaps. In the short term, air gaps will be obtained by oxygen plasma etching the polyimide out from under the resonator. This will require extreme care in electrical contact and in not compatible with the intended manufacturing or application. Air gaps can be made using a sacrificial layer 1010, as shown in FIG. 10. The air gap technology would employ a metal, such as tungsten or titanium, which can be sputtered inexpensively and readily etched using hydrogen peroxide. The availability of an environmentally benign, room temperature, low viscosity etchant is significant to the high volume, low cost creation of fine feature air gaps. The tungsten or titanium would be shadow masked onto the film at a thickness between 0.1μ and 1.0μ. Roll-to-roll technology could be used in a stepand-sputter process in which 12" square (for example) sections were deposited at a time.

Subsequent layers would include one or more of the following: an adhesion layer 1020 such as chromium, a strengthening layer 1030 such as amorphous or diamond-like carbon, and the conductive ground electrode metal if desired. The aluminum nitride 1040 would then be deposited, followed by the aluminum patterned metal 1050 and passivation layers 1060. Isolation of the top side of the FBAR or saw can be accomplished by laminating the sheet with a pitted or waffled sheet of compatible plastic. Other than the final aluminum layer, each step could be manufactured using shadow masks with >40 mil (1 mm) features and >5 mil (12.5μ) relative alignment requirements while providing the requisite small device. It might be possible to also shadow mask the aluminum pattern of the FBAR; however, photographic methods will likely be preferable. While the suspended resonator would not survive a significant direct impact, it would be only slightly more fragile than the fully "supported" resonator on plastic.

Figure 11:
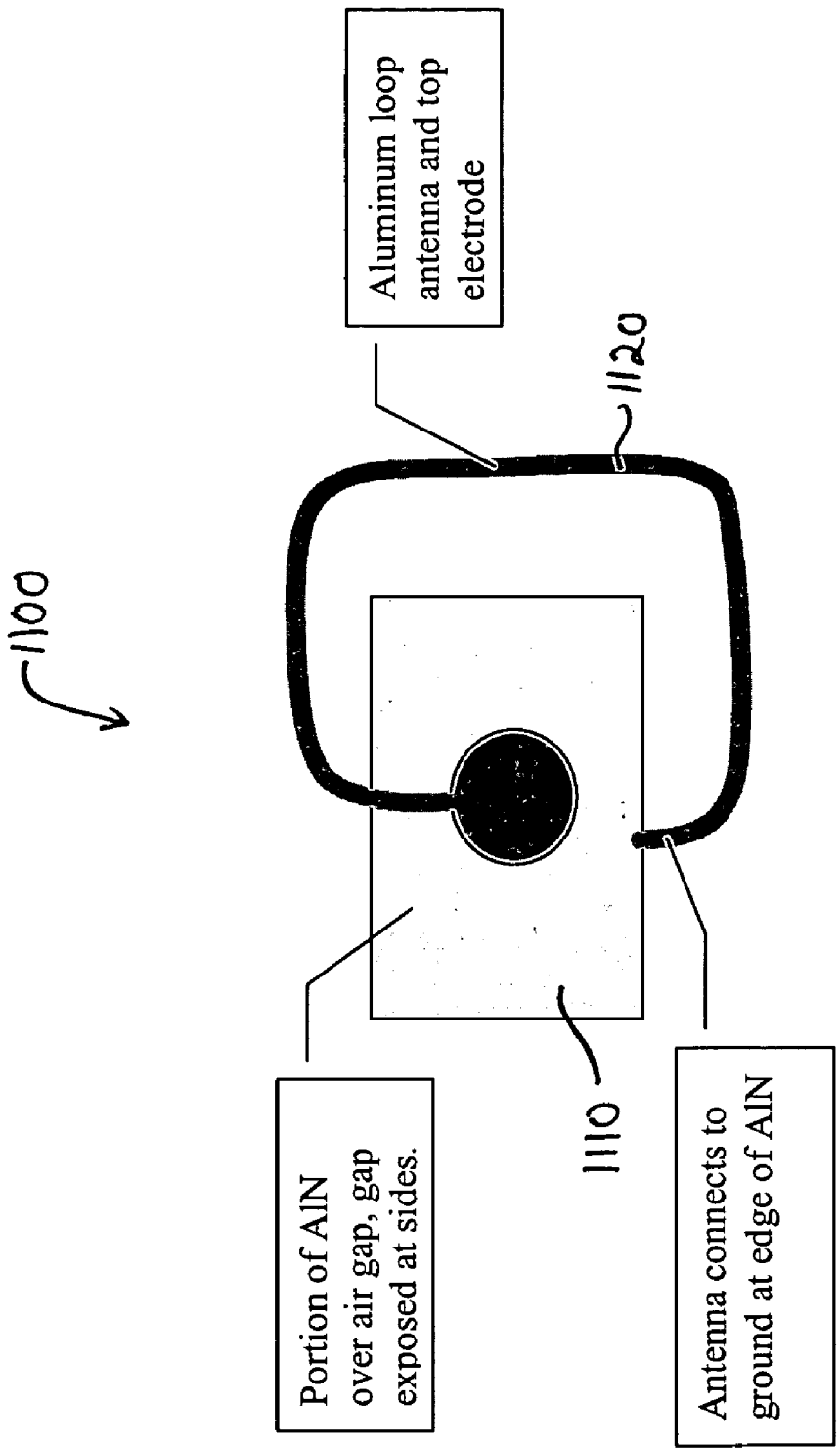
FIG. 11 is top view of one FBAR embodiment which can be used for a SAW device of the present invention.

Referring to FIG. 11, a simplistic FBAR 1100 would have the AlN layer 1110 physically supported on at least two sides with a "tunnel" etched underneath the AlN. The top aluminum layer would create the top resonator electrode, the loop antenna 1120 (or dipole, as required) and a contact via to the inner metal.

The inner metal (not shown), would extend outside the AlN island to allow contact with the aluminum step. Finally the peroxide etch of sacrificial material would be performed.

For a SAW device, a similar approach is viable, except that it may be undesirable to have metal under the AlN and all electrical contacts would be on the surface plane. Dielectric adhesion and support layers may be required.

Using air gaps may not be the preferred method. As such, a need may exist for an alternative method of isolating the acoustic wave from the substrate. For an FBAR, this may be accomplished using a high acoustic quality, high impedance layer approximately λ/4 thick. The sound wave reflecting from the AlN-mirror boundary and that reflecting from the mirror-substrate boundary have opposite sign but are offset by λ/2 of total signal path. The reflections add constructively to a high net reflectivity and, ideally, no energy is transmitted into the substrate. The actual thickness differs from λ/4 depending on the impedance of the resonator and substrate materials Using tungsten as the mirror layer may require about 0.55μ at 2400 MHz to obtain λ/4. The amplitude reflection coefficient between AlN and W is ~0.5. The reflection coefficient between W and UPILEX® high temperature resistant polyimide film is −0.94. This should be compared to the reflection coefficient of −0.85 between AlN and UPILEX® high temperature resistant polyimide film.

A one-dimensional MATLAB® model of the resonator indicated the following. The model started with total wave reflection at the UPILEX® high temperature resistant polyimide film-air boundary as a termination to a series of lossy transmission lines consisting of UPILEX® high temperature resistant polyimide film (50μ), aluminum (0.1μ), AlN (1.5μ), and aluminum (0.1μ). It calculated the electrical reflection coefficient seen looking into piezoelectric resonator.

Figure 12:
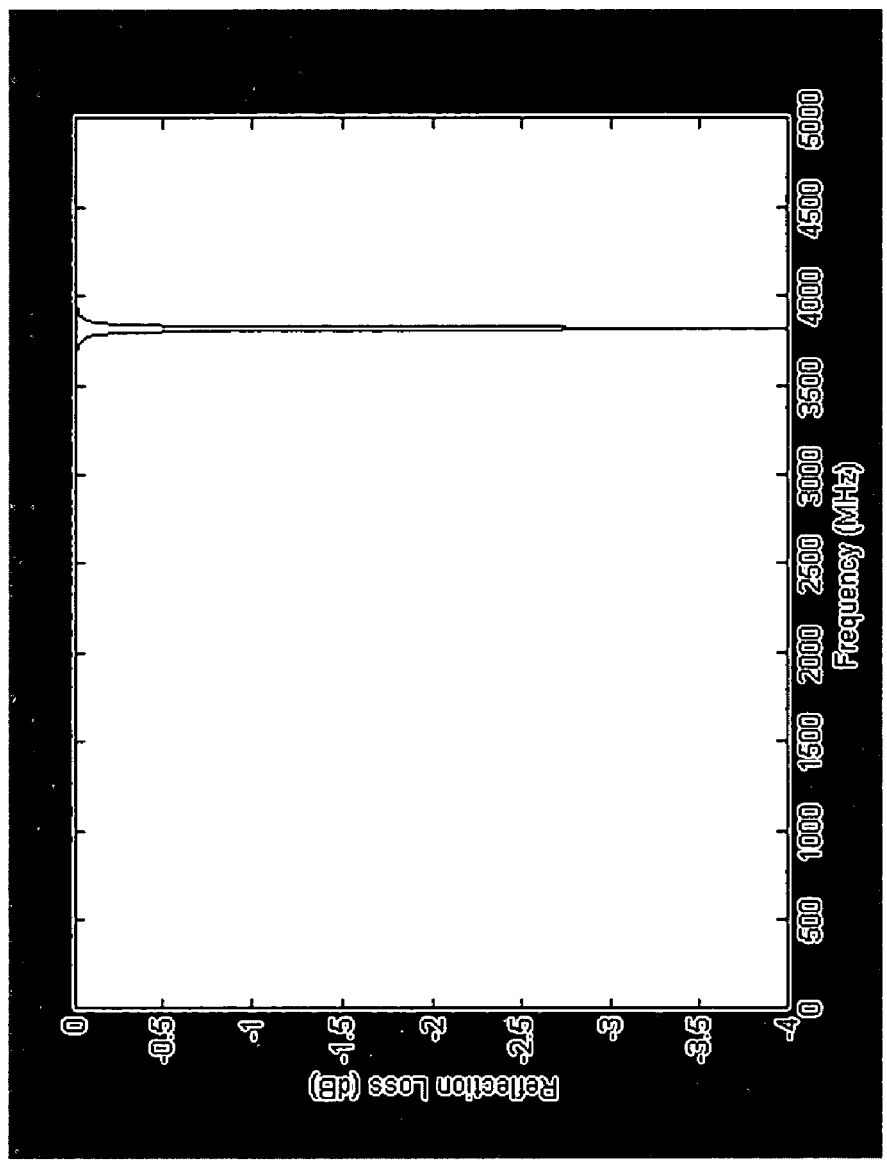
FIG. 12 is a graph of frequency to reflection loss for one embodiment of the SAW device of the present invention.

Referring to FIG. 12, with the lengths set to zero for UPILEX® high temperature resistant polyimide film and aluminum, it provides the below results for a 1.5μ AlN layer which is consistent with a theoretical 3700 MHz resonance. Adding the 0.1μ aluminum layers lowers the resonance to about 3400 MHz.

Figure 13:
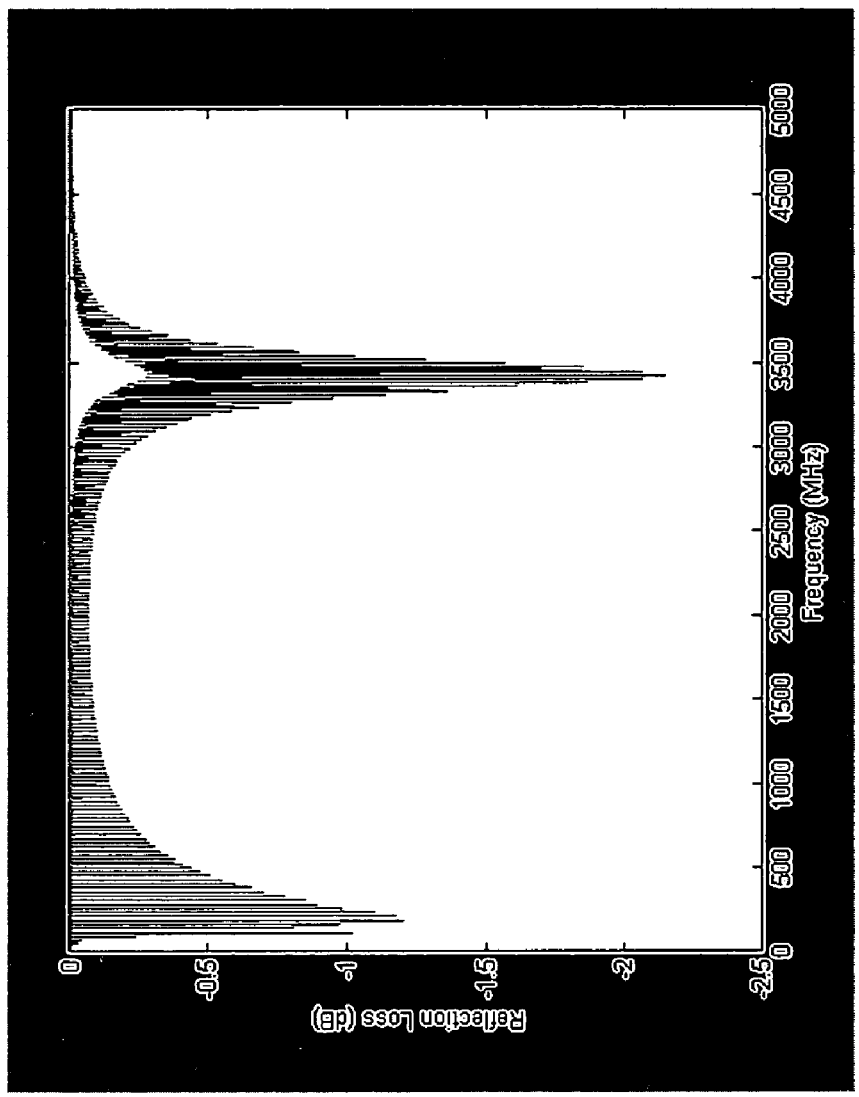
FIG. 13 is a graph of frequency to reflection loss for another embodiment of the SAW device of the present invention.

Referring to FIG. 13, adding the 50μ (2 mil) UPILEX® high temperature resistant polyimide film support but with low acoustic losses, one sees many acoustic reflections with sharp, well defined frequencies.

Figure 14:
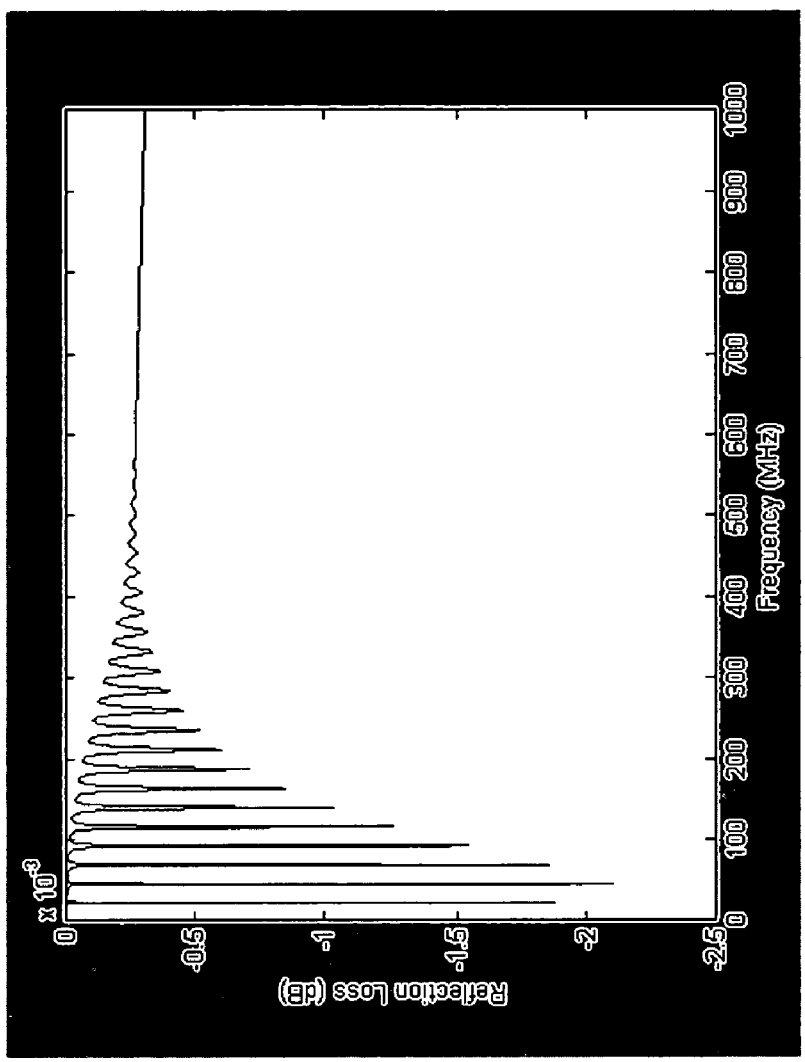
FIG. 14 is a graph of frequency to reflection loss for another embodiment of the SAW device of the present invention.

Referring to FIG. 14, reducing the acoustic quality factor to 15 GHz, the model correctly shows all resonances being suppressed beyond a few hundred MHz. The extremely small value of the reflection loss at the resonances compared to measured values is a result of the effect of small calibration errors and electrical matching effects.

Figure 15:
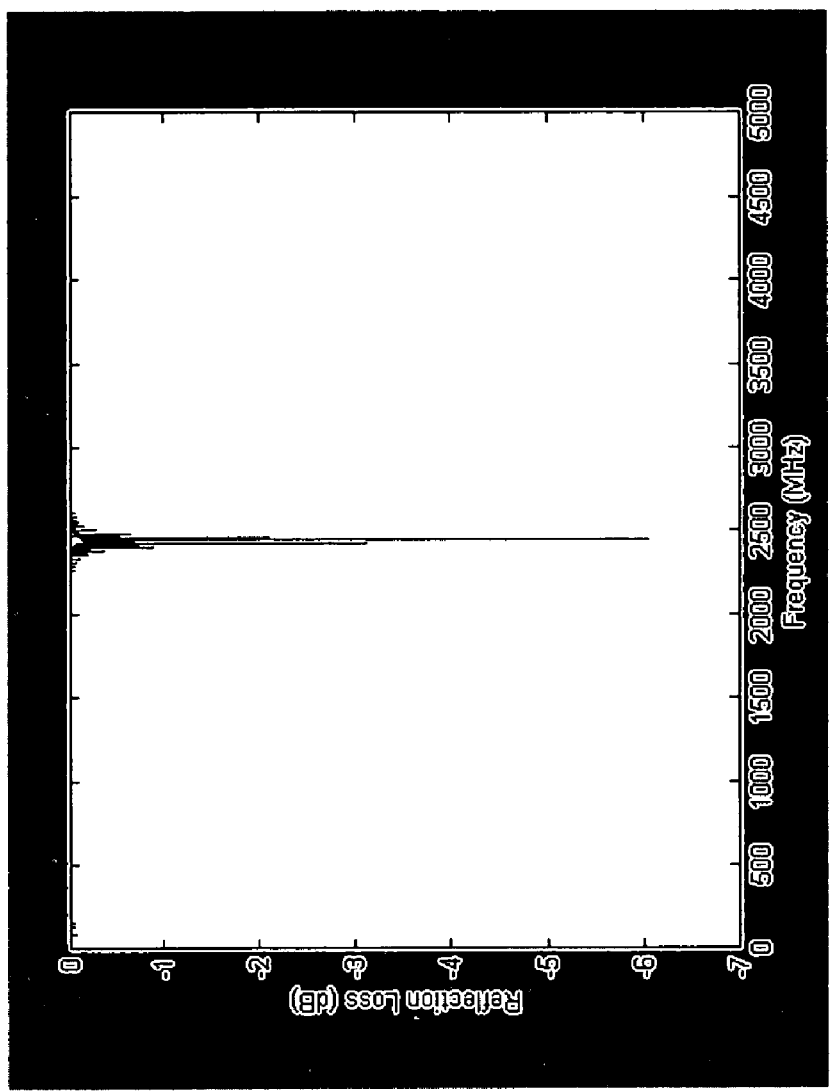
FIG. 15 is a graph of frequency to reflection loss for another embodiment of the SAW device of the present invention.

Referring to FIG. 15, placing a 0.5μ tungsten layer between the UPILEX® high temperature resistant polyimide film (assuming unrealistically high Q*F) and the aluminum and decreasing the AlN thickness to 0.75μ, one obtains a 2400 MHz resonance with adjacent resonances.

Figure 16:
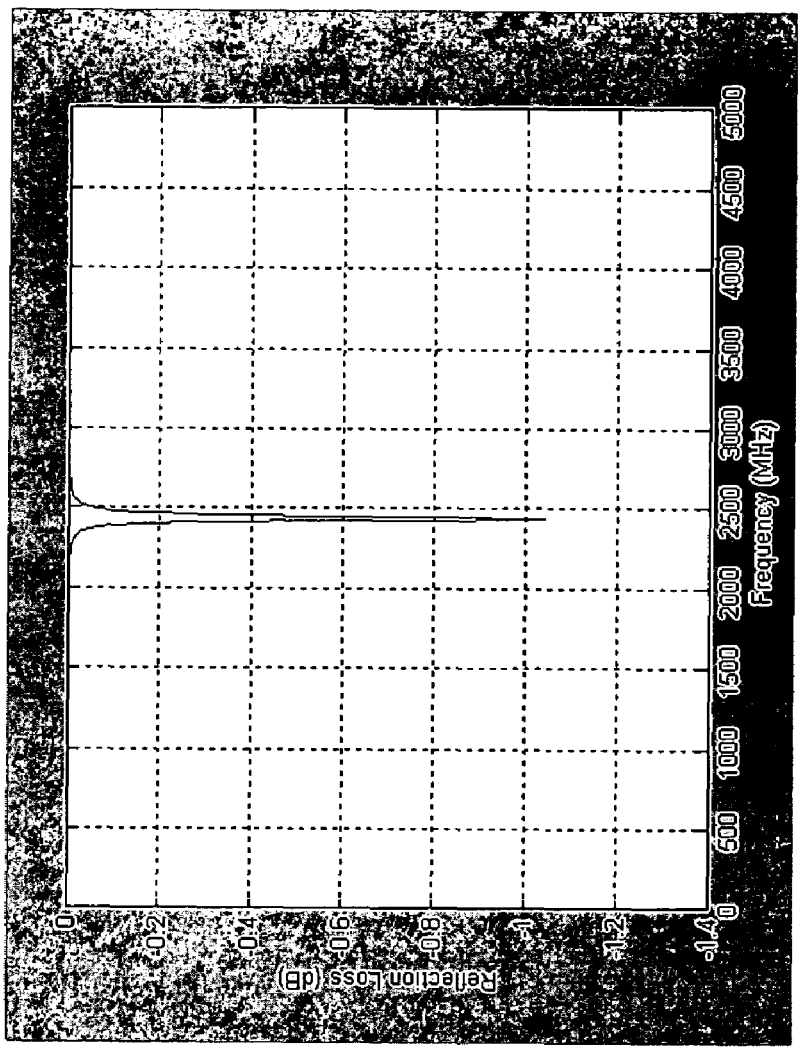
FIG. 16 is a graph of frequency to reflection loss for another embodiment of the SAW device of the present invention.

Referring to FIG. 16, employing a realistic Q*F of 15 GHz for UPILEX® high temperature resistant polyimide film, one sees a single resonance at 2437 MHz. Clearly a single layer mirror can have dramatic effects on the ability to keep the acoustic wave from being damped by the flexible substrate.

Figure 17:
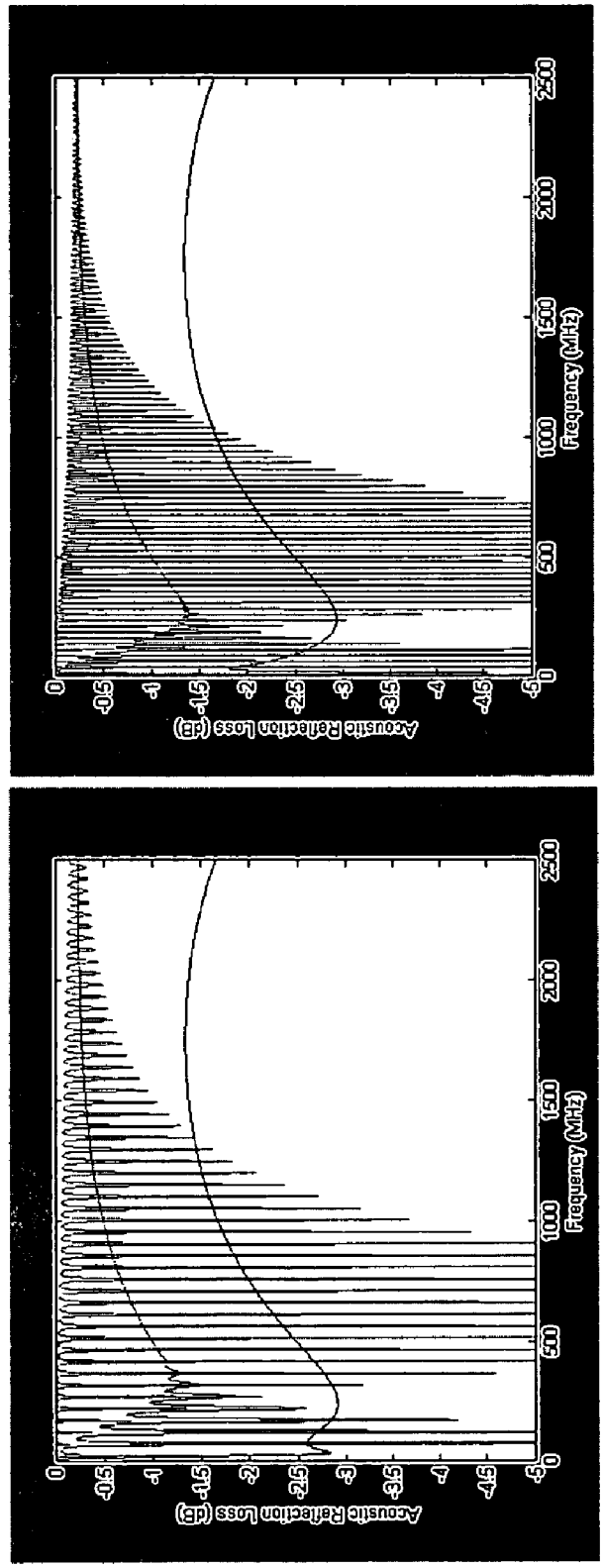
FIG. 17 is a graph of frequency to acoustic reflection loss for another embodiment of the SAW device of the present invention.
Figure 18:
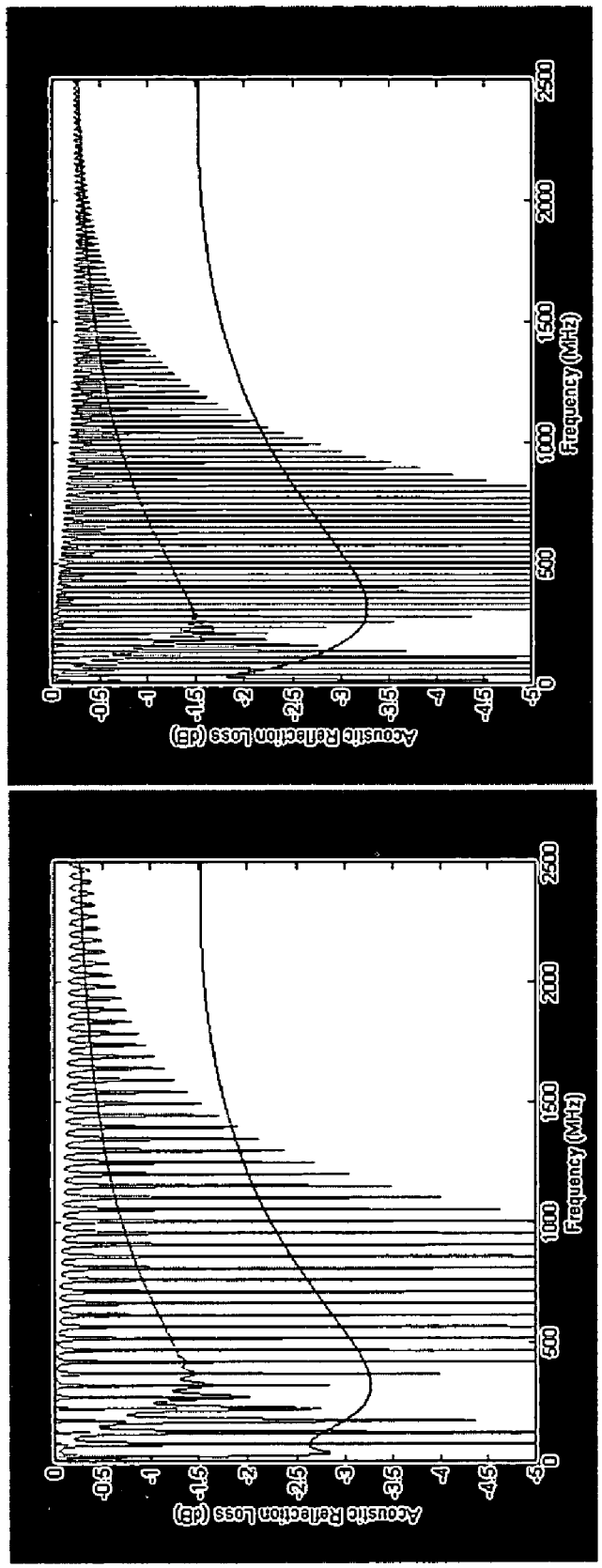
FIG. 18 is a graph of frequency to acoustic reflection loss for another embodiment of the SAW device of the present invention.

Referring to FIGS. 17-19, a tungsten layer thickness of 0.4μ optimally shields the FBAR resonator from the UPILEX® high temperature resistant polyimide film at 2400 MHz and even assuming a QF product 100 fold worse than the value inferred from initial measurements, the acoustic energy is 70% reflected back into the AlN. At the measured value 90% of the energy is reflected and the loss is independent of the UPILEX® high temperature resistant polyimide film thickness.

A 0.4μ layer of tungsten may be readily deposited but may exhibit excessive tensile stress, leading to bowing of the UPILEX® high temperature resistant polyimide film. Amorphous carbon is deposited with compressive stress and a sandwich of 0.15μ tungsten, 0.4μ carbon, and 0.15μ tungsten is also shown to offer significant isolation. The exact thicknesses can be adjusted to provide a zero net stress. Finally, the tungsten layer is a suitable starting layer for aluminum nitride and is an acceptable ground plane layer, making it unnecessary to deposit aluminum under the aluminum nitride. Nonetheless it may be chemically wise to start the AlN deposition as a thin aluminum layer for adhesion.

The combination of 0.4μ tungsten, 1.25μ aluminum nitride and 0.1μ aluminum is expected to offer a 2400 MHz resonator with an electrically loaded Q of 48 (QF=115.2× $10^9$ in 50Ω). Since the electrically loaded Q is invariant between 50Ω and 5Ω, it is concluded this is dominated by the material Q. While this is 10-fold lower than the target value, it is a worthy next step.

The QF product implies a time scale of 115 ns for ring-down times of a locator pulse or the equivalent of ~35 meters of free space propagation. The ring-down time is the 1/e (8.7 dB) decay of the signal. Instrumentation operating through 25 dB of ring-down decay, a modeled resonator could be used for signal at 330 ns (100 meters equivalent). This may require an analysis of antenna pattern, multi-path signal strength decay, etc. However, this IS a very desirable alteration to the pending films (inclusion of 0.4μ tungsten instead of aluminum).

Multi-layer mirrors can be developed for better QF product; however, the approach of acoustic mirrors is better employed to improve waveguiding of the final SAW device candidate. For the development of acoustic mirrors in a thin film bulk acoustic resonator (FBAR), tungsten, diamond and chromium offer good high-impedance layers. However, for SAW waveguiding the requirement is driven by the relative shear wave velocities and SAW velocities. Only diamond is fast compared to aluminum nitride.

While the specific embodiments have been illustrated and described, numerous modifications come to mind without significantly departing from the spirit of the invention, and the scope of protection is only limited by the scope of the accompanying Claims.

What is claimed is:

1. A surface acoustic wave device comprising:
a flexible substrate having a first side;
an acoustic mirror attached to at least a portion of the first side of the flexible substrate, the acoustic mirror having a first side;
a piezoelectric film attached to at least a portion of the first side of the acoustic mirror, the piezoelectric film having a first side;
a surface acoustic wave circuit adjoining at least a portion of the first side of the piezoelectric film; and,
a protective material overlaying at least a portion of the surface acoustic wave circuit.

* * * * *